(12) United States Patent
Holm-Peterson et al.

(10) Patent No.: US 8,810,595 B2
(45) Date of Patent: Aug. 19, 2014

(54) DECLARATIVE APPROACH FOR VISUALIZATION

(75) Inventors: Morten Holm-Peterson, Gentofte (DK); Christian Olaf Abeln, Ödåkra (DE); Thomas Michael Casey, Bellevue, WA (US); Stella Yick Chan, Redmond, WA (US); Benjamin L. Chronister, Duvall, WA (US); Ian Michael Dunmore, Redmond, WA (US); Roland L. Fernandez, Woodinville, WA (US); David Francis Gainer, Redmond, WA (US); Alexandre Gorev, Sammamish, WA (US); Barry J. Givens, Redmond, WA (US); Murali A. Krishnan, Bellevue, WA (US); Bongshin Lee, Issaquah, WA (US); Kelley T. Maves, Auburn, WA (US); George G. Robertson, Seattle, WA (US); Brian S. Ruble, Bellevue, WA (US); Gregory D. Schechter, Seattle, WA (US); Curtis G. Wong, Medina, WA (US); Jason Joseph Weber, Kirkland, WA (US)

(73) Assignee: Microsoft Corporation, Redmond, WA (US)

( * ) Notice: Subject to any disclaimer, the term of this patent is extended or adjusted under 35 U.S.C. 154(b) by 1519 days.

(21) Appl. No.: 12/146,671

(22) Filed: Jun. 26, 2008

(65) Prior Publication Data

US 2009/0322755 A1 Dec. 31, 2009

(51) Int. Cl.
| | | |
|---|---|---|
| *G06G 5/00* | (2006.01) | |
| *G06G 3/04* | (2006.01) | |
| *G06T 11/20* | (2006.01) | |
| *G09G 5/22* | (2006.01) | |
| *G06F 3/00* | (2006.01) | |
| *G06F 3/048* | (2013.01) | |
| *G06F 17/00* | (2006.01) | |
| *G06F 9/44* | (2006.01) | |
| *G06F 17/50* | (2006.01) | |
| *G06F 3/0486* | (2013.01) | |
| *G06F 17/22* | (2006.01) | |
| *G06F 17/30* | (2006.01) | |
| *G06F 3/0484* | (2013.01) | |
| *G06T 11/60* | (2006.01) | |

(52) U.S. Cl.
CPC .. *G06F 8/34* (2013.01); *G06F 8/71* (2013.01); *G06F 17/50* (2013.01); *G06F 3/0486* (2013.01); *G06F 17/2288* (2013.01); *G06F 17/5009* (2013.01); *G06F 17/30595* (2013.01); *G06F 3/04842* (2013.01); *G06T 11/206* (2013.01); *G06T 11/60* (2013.01)
USPC .......... 345/619; 345/440; 345/440.2; 345/35; 715/764; 715/763; 715/853; 715/762; 707/638

(58) Field of Classification Search
CPC ............. G06F 8/34; G06F 8/71; G06F 17/50; G06F 3/0486; G06F 17/2288; G06F 17/5009; G06F 17/30595; G06F 3/04842
USPC .......... 715/771, 764, 763, 853, 762; 345/619, 345/440, 440.2, 35; 707/E17.005, 999.102, 707/999.104, 999.103, E17.055, 638, 707/E17.045
See application file for complete search history.

(56) References Cited

U.S. PATENT DOCUMENTS

| | | | |
|---|---|---|---|
| 5,581,677 A | 12/1996 | Myers et al. | |
| 6,064,816 A * | 5/2000 | Parthasarathy et al. | 717/109 |
| 6,160,549 A | 12/2000 | Touma et al. | |
| 6,414,679 B1 * | 7/2002 | Miodonski et al. | 345/420 |
| 6,738,964 B1 * | 5/2004 | Zink et al. | 717/105 |
| 6,995,768 B2 | 2/2006 | Jou et al. | |
| 7,050,056 B2 | 5/2006 | Meyringer | |
| 7,212,208 B2 | 5/2007 | Khozai | |
| 7,249,328 B1 | 7/2007 | Davis | |
| 7,250,951 B1 | 7/2007 | Hurley et al. | |
| 7,948,448 B2 * | 5/2011 | Hutchinson et al. | 345/1.1 |
| 7,996,205 B2 * | 8/2011 | Cutts et al. | 703/22 |
| 2005/0057566 A1 | 3/2005 | Githens et al. | |
| 2006/0059414 A1 | 3/2006 | Cory et al. | |
| 2006/0136819 A1 | 6/2006 | Tolle et al. | |

| | | | |
|---|---|---|---|
| 2007/0168060 A1* | 7/2007 | Nixon et al. | 700/83 |
| 2007/0208992 A1* | 9/2007 | Koren | 715/503 |
| 2008/0086679 A1 | 4/2008 | Gazzillo et al. | |
| 2010/0325597 A1* | 12/2010 | Arsintescu | 716/111 |

OTHER PUBLICATIONS

Castelles, et al. Declarative Models of Presentation, Sep. 15, 1995. http://www.isi.edu/isd/Mastermind/Papers/chi96.ps. Last accessed Apr. 30, 2008, 9 pages.

Huang, et al. Model-Based Chart Image Recognition http://www.comp.nus.edu.sg/~tancl/Papers/GREC2003/grec03_14r_LNCS.pdf. Last accessed Apr. 30, 2008, 12 pages.

\* cited by examiner

*Primary Examiner* — Jeffrey Chow

(74) *Attorney, Agent, or Firm* — Dan Choi; Carole Boelitz; Micky Minhas

(57) ABSTRACT

The claimed subject matter relates to an architecture that can support a declarative model-based approach to designing, constructing, and rendering visualizations. By complying with a declarative descriptor, components can be readily customized by way of modifications to the model—declaratively specifying suitable features, behaviors, appearances and so forth. The descriptors that conform to the model can also facilitate connecting to various data sources and performing data transformation operations. Moreover, the descriptors that conform to the model can declaratively specify relationships based upon a scene layout. Accordingly, the architecture can further describe the scene layout and provide features based upon the layout.

20 Claims, 11 Drawing Sheets

DECLARATIVE APPROACH FOR VISUALIZATION

BACKGROUND

Today, components, controls, forms, or applications for data visualization are customarily developed with imperative languages or models. Imperative languages generally describe procedures or state changes, usually in the form of an algorithm. For example, procedural programming languages are a common way to imperatively describe program logic. Ultimately, imperative models generally result in monolithic program logic that on one hand is difficult to modify, yet on the other hand must specify all features and behaviors in advance, which often makes modification necessary since it is difficult to predict in advance all the features a customer or user might desire. By the same token, imperative models that are difficult to modify are therefore difficult to customize. Hence, reusability of the features included in applications generally suffers as many of those same features will need to be developed from scratch even when only a slight modification is needed given the difficulty associated with understanding another developer's previous work.

Moreover, especially in the business application arena, the general release of an application or tool often differs from the original development in a number of ways, at times quite substantially. Typically, this is a result of additions or modifications made by partners or even in some situations by large customers who desire to tailor the application to individual needs. As such, later upgrades to the application must account for these changes or the upgrade might not be compatible.

SUMMARY

The following presents a simplified summary of the claimed subject matter in order to provide a basic understanding of some aspects of the claimed subject matter. This summary is not an extensive overview of the claimed subject matter. It is intended to neither identify key or critical elements of the claimed subject matter nor delineate the scope of the claimed subject matter. Its sole purpose is to present some concepts of the claimed subject matter in a simplified form as a prelude to the more detailed description that is presented later.

The subject matter disclosed and claimed herein, in one or more aspects thereof, comprises an architecture that can facilitate a declarative approach to designing and constructing richly customizable and interactive data visualizations. In accordance therewith and to other related ends, the architecture can receive data that conforms to an extensible, declarative language or model specification. For example, the model can specify various descriptors that relate to a variety of elements a visualization application or another application can utilize to describe what features or behaviors can be modeled by the application to produce a visualization, e.g., a particular chart representation of underlying source data.

At least in the visualization application context, certain behaviors or actions are quite common. For instance, it is customary to choose a data source, and then apply some type of transformation operation to that data source in order to create an aggregation or filtered subset of the data source. Subsequently, the resultant data can then be visualized in domain-specific contexts to better understand the data or to perceive certain nuances within the resultant data. Accordingly, the descriptors defined by the declarative model can relate to these and other suitable elements. In particular, the declarative model can define one or more source descriptor, transform descriptor, and/or visualization descriptor.

In an aspect of the claimed subject matter each declared descriptor can be presented in a palette, which can be employed to interactively design, e.g., a visualization or chart. For example, one or more source elements (declared by a source descriptor) can be selected from the palette to populate a design canvas. These source elements can define or reference particular data sources. Likewise, one or more transform elements can be selected from the palette that describes the type of operation (e.g., filter, join . . . ) to apply to the data source. The resultant data obtained after the transform can be displayed according to a particular chart type (e.g., bar chart, pie chart, portions or components thereof . . . ) that can also be selected from the palette as well.

In an aspect of the claimed subject matter, the aforementioned descriptors can also declaratively describe behavior at virtually any scale. For example, in addition to describing a general type of chart to employ, a visualization descriptor can also declare individual behaviors and appearances. For instance, the visualization descriptor can be utilized to declare the axis layout of the chart, features included in scroll bars, available menus or controls and so forth. Moreover, since each feature can be declaratively described, any feature can be readily appended or omitted based upon a specific desire or motivation. Accordingly, the model can provide for virtually unlimited customization in a convenient, natural, and/or intuitive manner by simply plugging in or unplugging a selected feature, which can be accomplished by way of the design canvas or by modifying the declarations.

As another example, the descriptors can declare relationships between multiple charts, visualizations, or components. Accordingly, when suitable, the relationships can trigger other visualization features or even other models or external logic. In an aspect of the claimed subject matter, the relationships can be based upon a scene layout that can potentially provide meaning or additional context based upon the position of an element or object included in the layout and/or with other visualizations included at that location. In accordance therewith, an aspect of the claimed subject matter can provide simulations based upon the elements and relationships declared in the descriptors and/or extant in the layout.

The following description and the annexed drawings set forth in detail certain illustrative aspects of the claimed subject matter. These aspects are indicative, however, of but a few of the various ways in which the principles of the claimed subject matter may be employed and the claimed subject matter is intended to include all such aspects and their equivalents. Other advantages and distinguishing features of the claimed subject matter will become apparent from the following detailed description of the claimed subject matter when considered in conjunction with the drawings.

DETAILED DESCRIPTION

Figure 1:
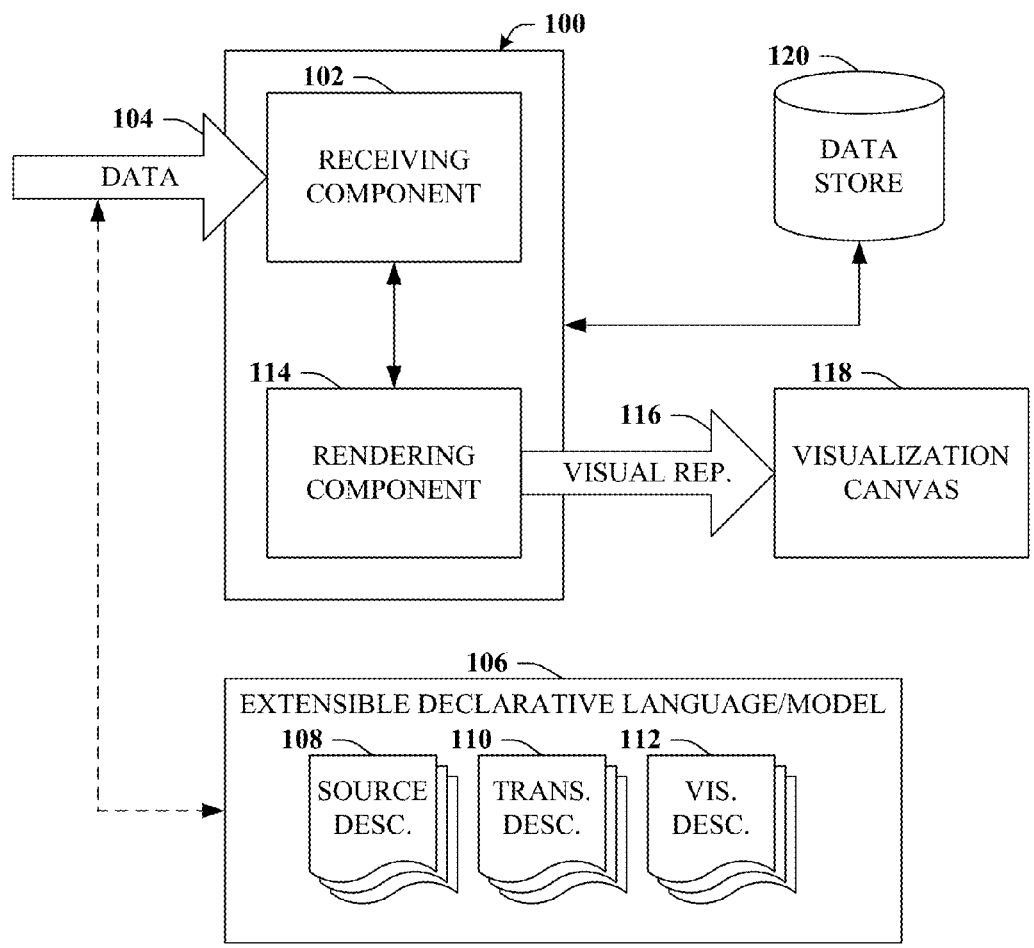
FIG. 1 illustrates a block diagram of a system that can facilitate a declarative approach to constructing richly customizable and interactive data visualizations.

The claimed subject matter is now described with reference to the drawings, wherein like reference numerals are used to refer to like elements throughout. In the following description, for purposes of explanation, numerous specific details are set forth in order to provide a thorough understanding of the claimed subject matter. It may be evident, however, that the claimed subject matter may be practiced without these specific details. In other instances, well-known structures and devices are shown in block diagram form in order to facilitate describing the claimed subject matter.

As used in this application, the terms "component," "module," "system," or the like can, but need not, refer to a computer-related entity, either hardware, a combination of hardware and software, software, or software in execution. For example, a component might be, but is not limited to being, a process running on a processor, a processor, an object, an executable, a thread of execution, a program, and/or a computer. By way of illustration, both an application running on a controller and the controller can be a component. One or more components may reside within a process and/or thread of execution and a component may be localized on one computer and/or distributed between two or more computers.

Furthermore, the claimed subject matter may be implemented as a method, apparatus, or article of manufacture using standard programming and/or engineering techniques to produce software, firmware, hardware, or any combination thereof to control a computer to implement the disclosed subject matter. The term "article of manufacture" as used herein is intended to encompass a computer program accessible from any computer-readable device, carrier, or media. For example, computer readable media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Additionally it should be appreciated that a carrier wave can be employed to carry computer-readable electronic data such as those used in transmitting and receiving electronic mail or in accessing a network such as the Internet or a local area network (LAN). Of course, those skilled in the art will recognize many modifications may be made to this configuration without departing from the scope or spirit of the claimed subject matter.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or." Therefore, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

As used herein, the terms "infer" or "inference" generally refer to the process of reasoning about or inferring states of the system, environment, and/or user from a set of observations as captured via events and/or data. Inference can be employed to identify a specific context or action, or can generate a probability distribution over states, for example. The inference can be probabilistic—that is, the computation of a probability distribution over states of interest based on a consideration of data and events. Inference can also refer to techniques employed for composing higher-level events from a set of events and/or data. Such inference results in the construction of new events or actions from a set of observed events and/or stored event data, whether or not the events are correlated in close temporal proximity, and whether the events and data come from one or several event and data sources.

As used herein, the term "declarative" is generally intended to refer to a language, model, or style of description. Typically, a declarative language describes features, function, or relationships, which can be contrasted with an imperative language that describes procedures or state changes, usually in the form of an algorithm. As one example, a declarative language can describe what to render, say a chart, whereas an imperative language focuses on how the chart is rendered. Furthermore, as used herein, the terms "language" and "model" are substantially used interchangeably.

Referring now to the drawings, with reference initially to FIG. 1, computer implemented system 100 that can facilitate a declarative approach to constructing richly customizable and interactive data visualizations is depicted. Generally, system 100 can include receiving component 102 that can receive data 104. Data 104 can conform to extensible declarative language (or model) 106. For example, data 104 can be text or a code portion that complies with a specification described by model or language 106. Typically, language (or model) 106 can include set 108 of source descriptors, each of which can declaratively describe a respective data source (detailed further infra in connection with FIG. 2). Language 106 can further include set 110 of transformation descriptors, each of which can declaratively describe a respective operation to be applied to the respective data source in order to yield a transformed result (also further detailed with reference to FIG. 2, infra). Additionally, language 106 can include set 112 of visualization descriptors, each of which can declaratively describe a respective visual representation, for instance one or more charts to be rendered, or sub-components of the one or more charts.

In addition, system 100 can further include rendering component 114 that can read a visualization descriptor from data 104, for example, information included in a portion of data 104 that conforms to visual descriptor 112 included in language 106. Next, rendering component 114 can compose an associated visual representation 116 of the transformed result in visualization canvas 118. For instance, rendering component 114 can compose the one or more charts or another visual representation 116 and display the visual representation 116 to visualization canvas 118. It should be appreciated that rendering component 114 can compose visual representation 116 or other aspects included in visualization canvas 118 imperatively independently of language 106 or data 104. However, rendering component 114 will typically be based upon the declarative properties of language/model 106.

For example, visualization descriptors 112 included in language 106 or that portion of data 104 can indicate what to render, but need not necessarily describe how such will be rendered by the rendering component. Accordingly, rendering component 114 can compose visual representation 116 in a platform-specific manner, while in other cases visual representation 116 can be platform-independent. In other words, the platform can, but need not, be a factor in the overall appearance, behavior, and/or features of visual representation 116. For the sake of completeness, it should be understood that visualization canvas 118 can be substantially any hardware or software type display such as a monitor, desktop, or windowed section, and can include associated input components as well as substantially any other I/O components suitable for a computer-based interface environment.

System 100 can also include or be operatively connected to data store 120. Data store 120 is intended to be a repository of all or portions of data, data sets, or information described herein or otherwise suitable for use with the claimed subject matter. Thus, although depicted as distinct components data store 120 can include all or portions of language 106 or data 104. Data store 120 can be centralized, either remotely or locally cached, or distributed, potentially across multiple devices and/or schemas. Furthermore, data store 120 can be embodied as substantially any type of memory, including but not limited to volatile or non-volatile, sequential access, structured access, or random access and so on. It should be understood that all or portions of data store 120 can be included in system 100, or can reside in part or entirely remotely from system 100.

In accordance with the foregoing, one of skill in the art can readily appreciate numerous benefits of the claimed subject matter that can potentially meet long felt needs across many domains. As one example, in the business application domain as well as other domains, software applications rarely, if ever, ship in the form finalized by application developers. Rather, such software applications typically are modified by partners or even large customers prior to general release. By defining the application declaratively, such modifications can be much simpler than with traditional code that is imperatively constructed. Moreover, even after release, partners or customers can customize the application. As a result, whether modifications or customizations occur before or after release, upgrades become much more complex and generally will be impossible without specifically tailoring an upgrade to each customized version of the original application. However, with a declarative model, a model for the business application can be read and any elements with a new version can be upgraded quite simply.

Due to such easy customization, component sharing can be another benefit of the claimed subject matter. For example, consider a visualization component. Typically, such a visualization component will be constructed as a monolithic executable that is suited for a particular situation or need. As a result, the component becomes wholly unsuitable for a second developer with a similar need who requires, say, a slightly different axis layout. Consequently, the second developer must construct her own component from scratch even though the bulk of the original visualization component would have been suitable but for the small difference. In some cases, the first component might have been developed with the ability to modify the axis layout, however, even in such cases, the original developer must first conceive of the feature in advance and code that feature into the component.

In contrast, the declarative capabilities described herein can readily allow the second developer to open up the component and adjust the necessary axis layout without the need for constructing the visualization component from scratch or to reverse engineer the existing code or attempt to understand another party's coding style. Rather the second developer can make any desired changes quite simply, plug in additional features, or even unplug superfluous features. Second, the original developer need not contemplate all the potential uses for his own component in order to create a widely useful and readily reusable component. More detail in connection with the foregoing can be found with reference to FIG. 4.

Figure 2:
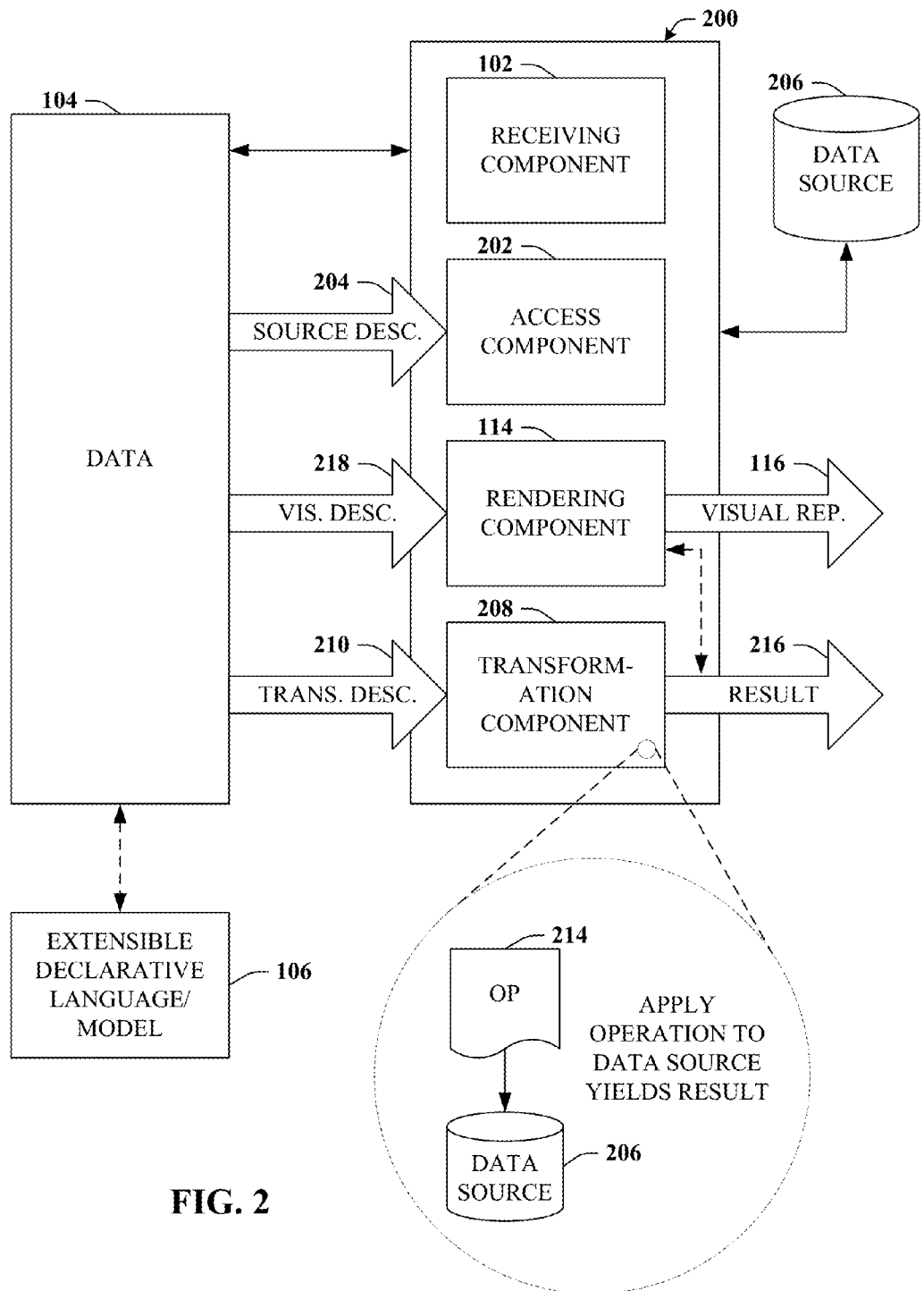
FIG. 2 illustrates a block diagram with additional features and/or further detail of a system that can facilitate a declarative approach to constructing richly customizable and interactive data visualizations.

Turning now to FIG. 2, computer implemented system 200 can be found, which illustrates additional features and/or further detail of a system that can facilitate a declarative approach to constructing richly customizable and interactive data visualizations. In general, system 200 can include receiving component 102 that can receive data 104, wherein data 104 conforms to extensible declarative language/model 106 as substantially described supra in connection with FIG. 1. Likewise, system 200 can include rendering component 114 that can read visualization descriptor 218 from data 104 and further compose visual representation 116 in a manner substantially similar to that detailed previously.

Additionally, system 200 can include access component 202 that can read source descriptor 204 from data 104. Access component 202 can further access an associated data source 206. Data source 206 can be, e.g., substantially any database such as a relational database or a spreadsheet; an entity (e.g., a set of related records) or a data set included in the database; a collection of entities or data sets included in the database, or a collection of databases. Additionally or alternatively, data source 206 can be substantially any suitable data, including a buffer or data that resides in local volatile memory, and further need not in all cases directly relate to a database.

System 200 can also include transformation component 208 that can read transform descriptor 210 from data 104. Furthermore, transformation component 208 can apply an associated operation 214 to data source 206 in order to generate transformed result 216, as is depicted in the call out. Appreciably, result 216 can represent the underlying data that rendering component 114 employs to produce visual representation 116. Typically, operation 214 will be associated with data source 206 in that operation 214 is applied to that particular data source 206. By way of illustration, operation 214 can be a filter operation, a slice operation, an aggregation operation, a sort operation, or a join operation, or the like that acts on data source 206. The representative effects of operation 214 can be output to rendering component 114 as result 216, which can be, in turn, employed to produce visual representation 116. As another example, operation 214 can be a purely visual transformation such as, e.g., switching between a bar chart and a pie chart, wherein the representative data is not altered. Appreciably, operation 214 can also be an arithmetic operation or transformation as well.

To facilitate ready understanding, it should be highlighted that descriptors 204, 210, and 218 can be distinguished from descriptors 108, 110, and 112 from FIG. 1. For example, source descriptor 108, transformation descriptor 110, and visualization descriptor 112 represent suitable aspects of the declarative model/language 106. On the other hand, source descriptor 204, transformation descriptor 210 and visualization descriptor 218 represent actual data (e.g., representative portions of data 104) that conform to the descriptions of like components from model 106. It should further be understood that all components included in system 200, namely components 102, 114, 202, and 208 can be operatively or communicatively coupled. Moreover, system 200 can also include or be communicatively coupled to data store 120.

Figure 3A:
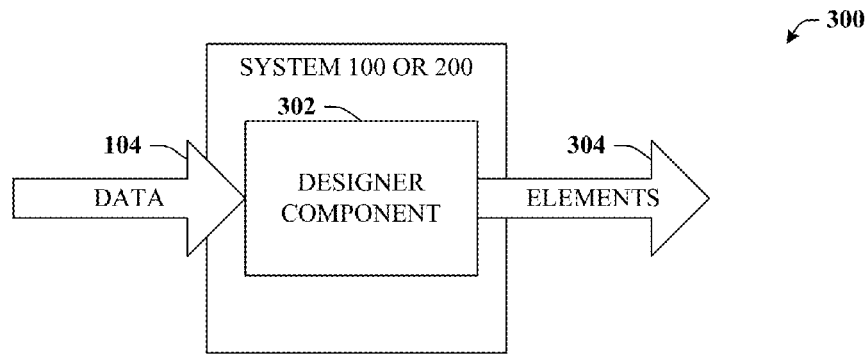
FIG. 3A depicts a block diagram of a system that can facilitate a declarative approach to providing design elements.

With reference now to FIG. 3A, computer implemented system 300 that can facilitate a declarative approach to providing design elements is provided. System 300 can include all or portions of system 100 or system 200 detailed supra with reference to FIGS. 1 and 2. In addition, system 300 can include designer component 302 that can receive all or portions of data 104, wherein data 104 complies with declarative model 106. Designer component 302 can generate set 304 of visual design elements, which is further detailed in connection with FIG. 3B.

Figure 3B:
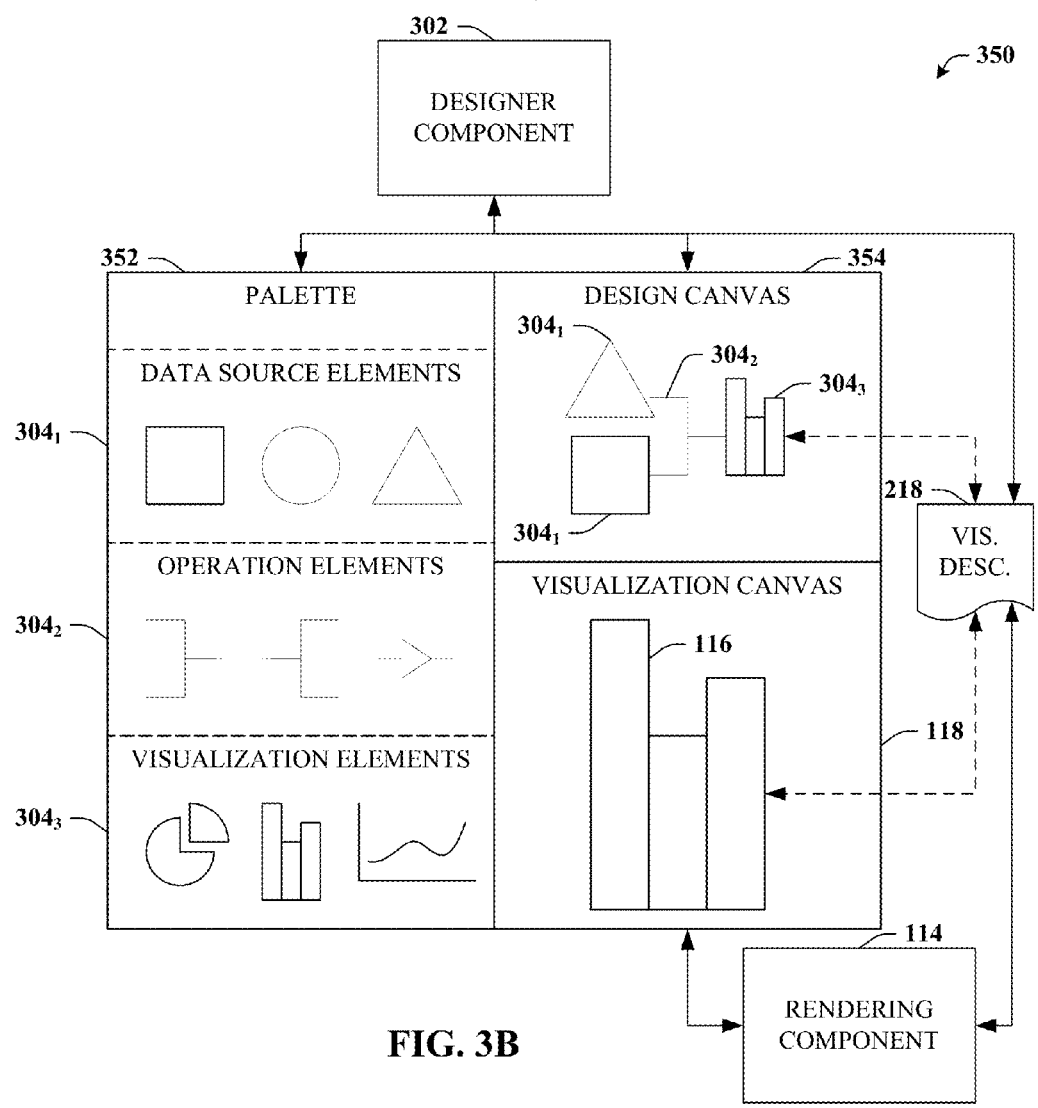
FIG. 3B is a block diagram of a system that can facilitate a declarative approach to deigning data visualizations.

FIG. 3B illustrates system 350 that can facilitate a declarative approach to deigning data visualizations. Generally, system 350 can include designer component 302 as detailed above in FIG. 3A. In addition, system 350 can include design palette 352 and an interactive design canvas 354. Designer component 302 can display all or a portion of set 304 of design elements in palette 352. As an example, depicted are three types of design elements 304: data source elements $304_1$, operation elements $304_2$, and visualization elements $304_3$. Data source elements $304_1$ can reference and represent available data sources to choose from as provided for in source descriptor 204 included in data 104, and which conform to source descriptor 108 of model 106. For example, each data source element $304_1$ can relate to a different database, a different portion of a database, a different version of the database, a different collection of databases and so forth. Here, data source elements $304_1$ are depicted abstractly as a square, circle, and triangle, respectively.

Likewise, operation elements $304_2$ and visualization elements $304_3$ relate to transformation descriptor 210 and visualization descriptor 218, respectively, both of which can be included in portions of data 104 and conform to like descriptors defined by model 106. Operation elements $304_2$ shown here can represent, e.g., an aggregation operation, a decomposition operation and a filter operation. Similarly, visualization elements $304_3$ depicted in system 350 can correspond to different chart types of visualization. In this case, a pie chart, a bar chart, and a graph or plot along axes.

Both palette 352 and design canvas 354 can be substantially similar to visualization canvas 118 in that both can be implemented as virtually any type of hardware or software (or a combination thereof) display and can include suitable I/O components for rich interface or interaction. Palette 352 and design canvas 354 can each or both be coupled to, or exist as a portion or an extension of visualization canvas 118, such as when implemented within the same desktop, window, or monitor. However, it should be appreciated that in such cases, there will usually be a clear demarcation (visually or otherwise) between palette 352 and one or both design canvas 354 and visualization canvas 118, and I/O policies or rules for interaction will typically differ. For example, palette 352 can be displayed as a thin strip of screen real estate on one side of canvas(es) 118, 354.

Elements 304 can be selected from palette 352 and displayed in design canvas 354, e.g., in a drag-and-drop manner, by clicking, gesturing, or in some other manner. Accordingly, appearance, type, features, behavior, etc. as well as what data sources 206 to employ and what operations 214 to apply to those data sources 206 can be designed in design canvas 354 in a convenient and intuitive manner. Furthermore, the type of visualization as well as other features that will exist in visual representation 116 (displayed in visualization canvas 118) can be readily selected. In this case, a bar chart (e.g., visualization element $304_3$) has been selected as the format in which visual representation 116 will ultimately be formatted. It should be appreciated that visualization elements $304_3$ can describe individual sub-components of visual representation 116 rather than, or in addition to, the holistic output. For example, palette 352 can include visualization elements $304_3$ that represent an individual bar of the bar chart, a pie section, an layout, and so forth as well as the complete bar chart, which can, e.g., act as a parent container for other visualization elements $304_3$ in palette 352.

In an aspect of the claimed subject matter, designer component 302 can adapt visualization descriptor 218 based upon a composition displayed in design canvas 354. For example, designer component 302 can append or otherwise modify relevant portions of data 104 based upon visual elements 304 constructed in design canvas 354. It should be appreciated that while depicted as separate items, design canvas 354 can exist as the same display region as visualization canvas 118. For instance, the behavior of the canvas at a given time can be based upon toggling modes from a menu provided by designer component 302 or some other component. Likewise, designer component 302 can be included in rendering component 114, which typically handles compositions that take place in visualization canvas 118.

Figure 4:
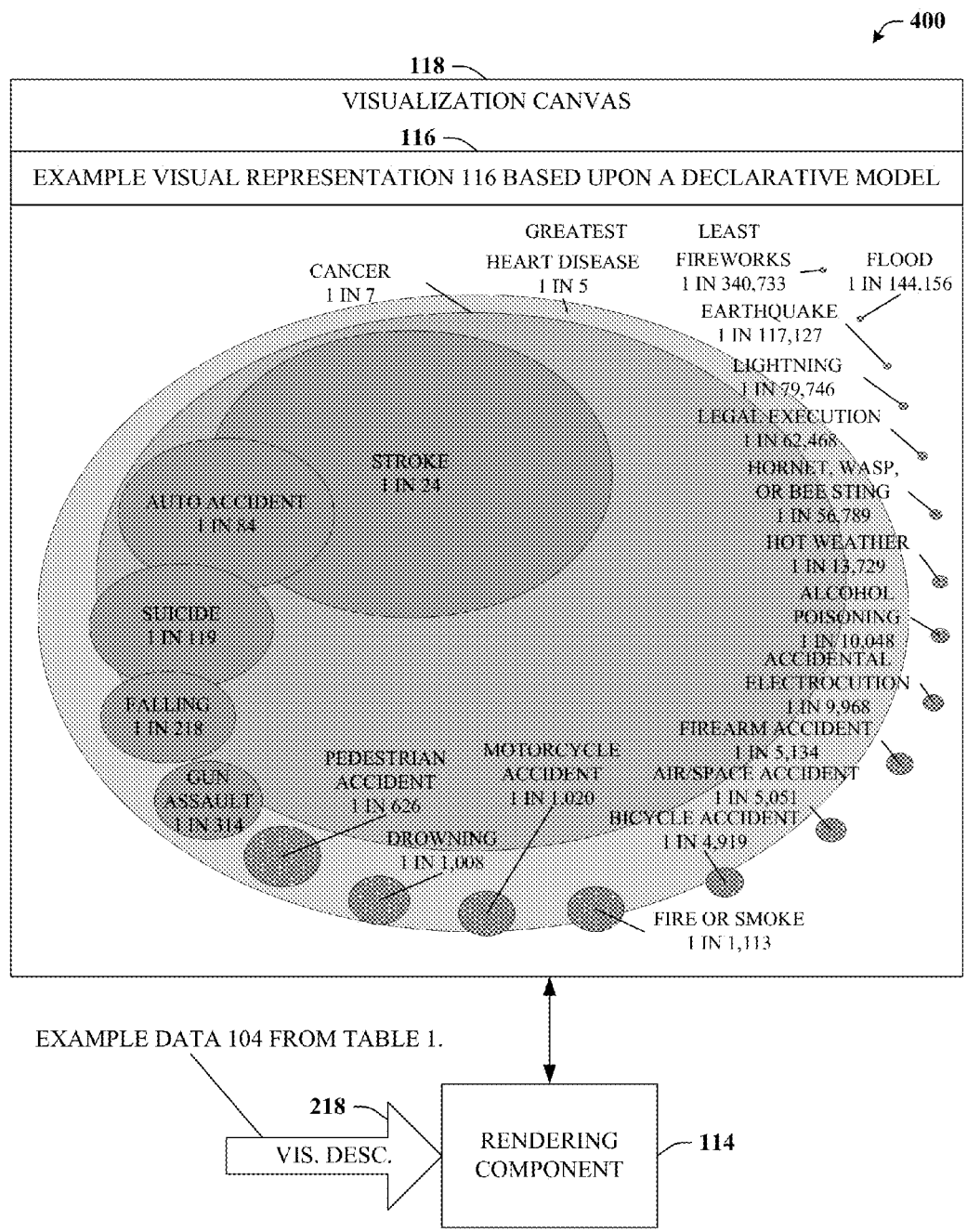
FIG. 4 illustrates a block diagram of a system that depicts an exemplary visual representation 116 based upon a declarative model.

Referring to FIG. 4, system 400 depicts an exemplary visual representation 116 constructed based upon a declarative model. In particular, system 400 can include visualization canvas 118, wherein rendering component 114 composes visual representation 116 based upon constructs defined by model 106 and which can be expressly included in at least a portion of data 104. In this example, source descriptor 204 corresponds to statistical data relating to causes of death. Transformation descriptor 210 can be a filter of the least represented causes or a classification by cause. Visualization descriptor 218 can be a spiral chart ordered from highest to lowest, with each data point represented by a circle with radius representative of the magnitude of deaths by that particular cause.

Table 1, infra, provides an example of data 104 that can be employed for rendering the spiral chart described above and depicted in FIG. 4. In addition, Table 1 includes a number of call outs to provide more detailed information with respect to the data or this example declarative model.

TABLE 1

```
Pseudo- markup, ignoring namespaces etc.

<VISUALIZATION Name="Spiral">
    <BINDINGS>                                     ──── List of inputs supplied to
        <PROPERTY Name="Title" />                        generate the visualization. Can
        <SERIES Name="data" Type="Numeric"               include suitable scalars and/or
            Description="The size of the circles" />     vectors
        <SERIES Name="labels" Type="String" />
    </BINDINGS>
    <DATAPIPELINE>                                 ──── Processing that can occur on a
        <NORMALIZE Input="data" Output="data2"           vector and can produce
            Largest="100" />                             another vector, such as: Sort,
        <SORT Input="data2" Output="sizes"               Normalize, Group, Pivot,
            Order="Descending" />                        Filter, etc.
        <COLORGENERATOR
            Input="sizes" Output="colors"          ──── This section can also
            Type="Linear" Scheme="AlphaGrayscale" />     includes data generators (in
        <SPIRALPATHGENERATOR                             this case a reusable color or
            Input="sizes" OutputX="x" OutputY="y" />     path generator)
    </DATAPIPELINE>
                                                   ──── Exemplary layout
                                                        elements
    <DOCKPANEL LastChildFill="True">

<TEXTBLOCK Align="center" Dock="top">
        @Title                                     ──── Expansion of parameters
    </TEXTBLOCK>

<FOREACH Input="@sizes" ID="n">                ──── A Smart Label that positions
        <CIRCLE ="@x[n]" Top="@y[n]"                    itself with intelligent
            Size="@sizes[n]" >                          behavior, such as: Inside or
            <SMARTLABEL Type="InsideOrAdjacent"         adjacent to the parent element
                <TEXTBLOCK Text="@labels[n]"            (unless it doesn't fit then it
                    Style="Bold" />                     can use a call out), avoid
                <TEXTBLOCK Text="@sizes[n]" />          occlusion, auto-resize, etc.
            </SMARTLABEL>
            <GLOWACTION ON="Hover" />
        </CIRCLE>                                  ──── A functionally complete
    </FOREACH>                                          behavior that attaches itself to
                                                        the parent element.
    </DOCKPANEL>
</VISUALIZATION>
```

According to an aspect of the claimed subject matter, visual representation 116 can be a chart, which is apparent from this example depicting a spiral chart. Moreover, visualization descriptor 218 from data 104 can declaratively describe appearance, behavior, or features of visual representation 116 in an extensible manner. Hence, the appearance, behavior, or features of visual representation 116 can be selectively reconfigured by modification of visualization descriptor 218 included in data 104.

Figure 5A:
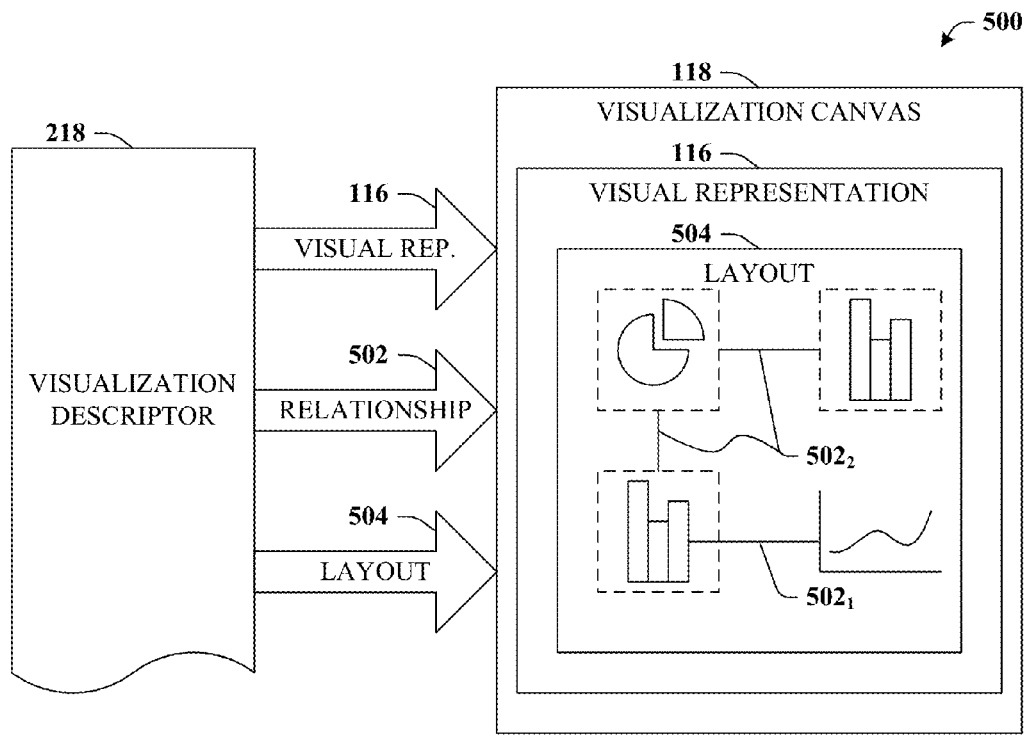
FIG. 5A is a block diagram of a system that can declaratively describe a scene layout.

With reference now to FIG. 5A, computer implemented system 500 that can declaratively describe a scene layout is illustrated. Generally, system 500 can include visualization canvas 118 within which visual representation 116 can exist. According to an aspect of the claimed subject matter, visual representation 116 can include multiple charts or visualizations. In such cases, visualization descriptor 218 can declaratively express relationship 502 for each of the multiple charts or visualizations that can interact in some manner. For example, relationship 502 can exist between the charts themselves as denoted by reference numeral $502_1$. Accordingly, one chart can trigger another chart or be related in some other way. Moreover, charts can form relationship 502 in a graphical manner such as by overlaying a chart or element with another one, or relationship 502 can be expressly declared.

Additionally or alternatively, relationship 502 can be based upon a position of the chart within visual representation 116 and/or visualization canvas 118 as depicted by reference numeral $502_2$. In accordance therewith, visualization descriptor 218 can declaratively describe layout 504, which can exist in visual representation 116 and by proxy visualization canvas 118, wherein layout 504 defines various relationships 502, typically based upon a meaning attached to a position or spatial relationships. Hence, in addition to composing visual representation 116 with a single chart, rendering component 114 can function as a scene builder as well. Appreciably, such a feature can naturally lend itself to simulation and other distinguishing modeling aspects which is further detailed in connection with FIG. 5B.

Figure 5B:
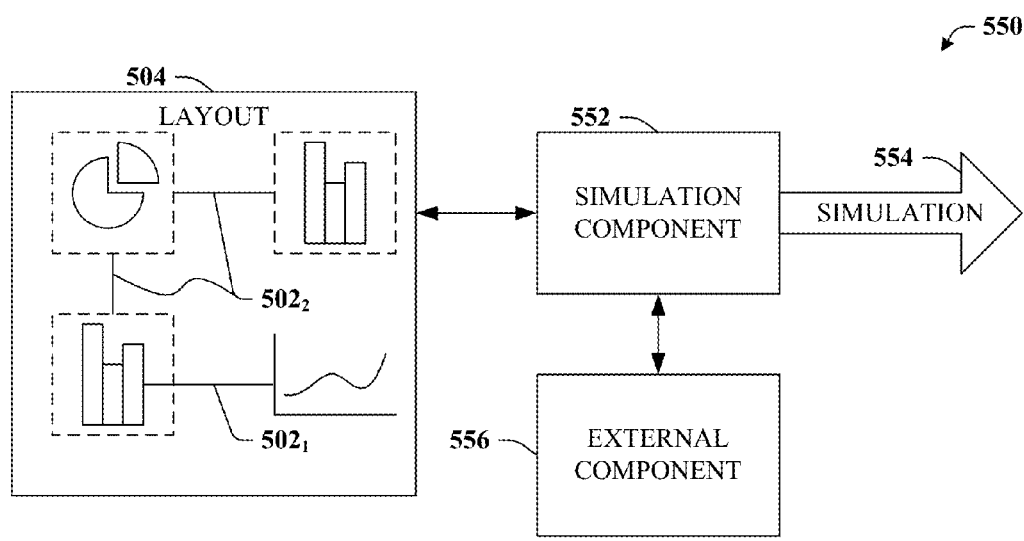
FIG. 5B illustrates a block diagram of a system that can provide simulated results of a declaratively described layout.

Referring now to FIG. 5B, computer implemented system 550 that can provide simulated results of a declaratively described layout is depicted. As with other systems described herein, system 550 can include all or portions of other systems or components detailed herein. Additionally, system 550 can include simulation component 552 that can provide simulation 554 of layout 504. According to an aspect of the claimed subject matter, simulation component 552 can call external component 556 in order to invoke specific logic for simulation 554. For example, certain rules can exist in visual descriptor 218, which can be automatically applied by simulation component 552. However, in other cases, especially for more complex or customer specific rules or logic, external component 556 can be declaratively described, plugged into the model, and triggered appropriately.

Appreciably, layout 504 as well as other components or features detailed herein lend especially well to building a scene of, say, machines in a production facility or warehouses around the globe for a particular business or customer. As one example feature, quantities of good can be moved from one location (e.g., representing a warehouse) in layout 504 to another location. Accordingly, simulation component 552 can simulate the costs or other consequences associated with such a move based upon internal rules, declaratively described plug-ins, and/or external logic potentially provided by external component 556.

Figure 6:
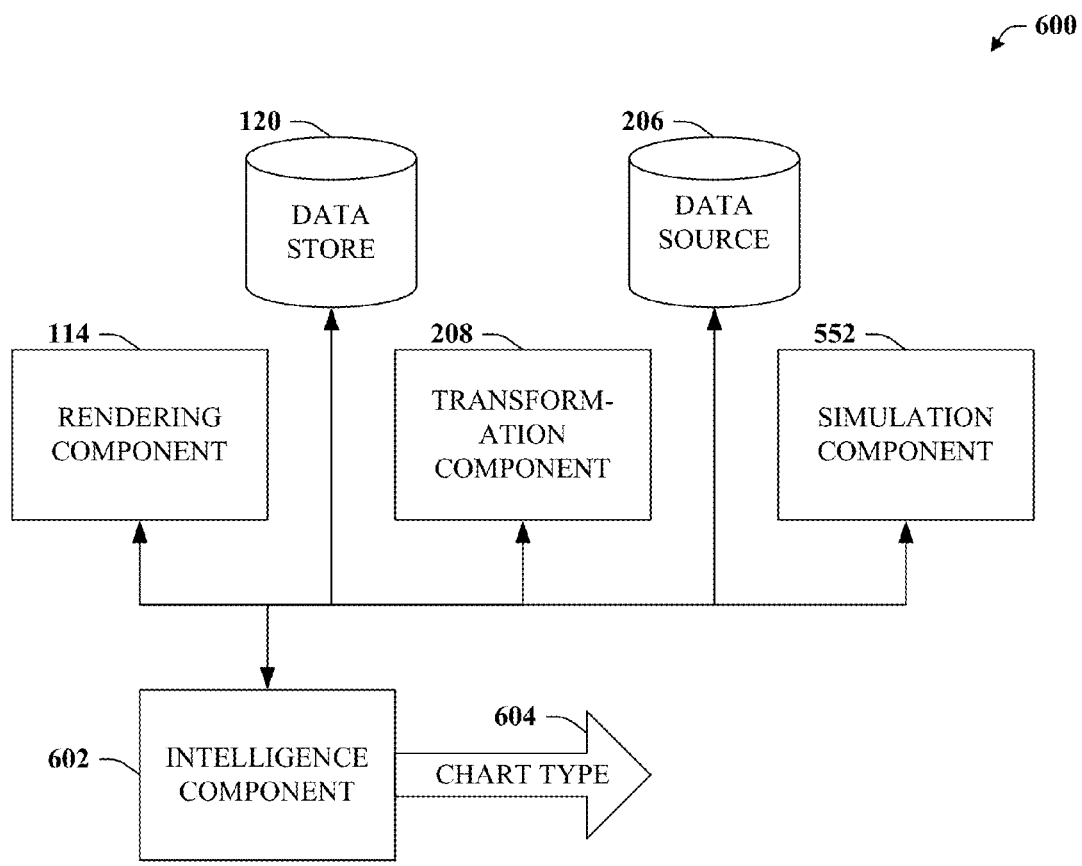
FIG. 6 is a block diagram of a system that can perform or aid with various determinations or inferences.

Turning now to FIG. 6, system 600 that can perform or aid with various determinations or inferences is depicted. Typically, system 600 can include rendering component 114, transformation component 208, and simulation component 552, which in addition to or in connection with what has been described supra, can also make various inferences or intelligent determinations. For example, rendering component 114 can employ machine learning techniques or inferences to intelligently render visual representation 116. One example can be the smart label detailed in Table 1. Of course other examples exist, especially with respect to placement of elements within layout 504 (or visual representation 116). Any such elements or components can be auto-sized based upon available display space and occluding objects. Moreover, any composition performed by rendering component 114 can be based upon detection of existing constraints such as I/O, hardware, platform and so forth.

Likewise, transformation component 208 can make intelligent determinations or inferences. As one example, if data source 206 includes null values or missing data, transformation component 208 can, e.g., prior to applying operation 214 replace or introduce meaningful data. In some cases this can be simply adding zeroes, while in other cases the newly introduced values can be based upon examination of similar or local data sets. Bayesian or stochastic techniques can be utilized as well machine learning to generate the new data. Next, simulation component 552 can also make intelligent determinations or inferences. As one example, inferring a particular external component 556 can be performed in some cases when current logic is determined to be insufficient.

In addition, system 600 can also include intelligence component 602 that can provide for or aid in various inferences or determinations. It is to be appreciated that intelligence component 602 can be operatively coupled to all or some of the aforementioned components, e.g., 114, 208, 552. Additionally or alternatively, all or portions of intelligence component 602 can be included in one or more components described herein. Moreover, intelligence component 602 will typically have access to all or portions of data sets described herein, such as data store 120, and can furthermore utilize previously determined or inferred data.

Accordingly, in order to provide for or aid in the numerous inferences described herein, intelligence component 602 can examine the entirety or a subset of the data available and can provide for reasoning about or infer states of the system, environment, and/or user from a set of observations as captured via events and/or data. Inference can be employed to identify a specific context or action, or can generate a probability distribution over states, for example. The inference can be probabilistic—that is, the computation of a probability distribution over states of interest based on a consideration of data and events. Inference can also refer to techniques employed for composing higher-level events from a set of events and/or data.

Such inference can result in the construction of new events or actions from a set of observed events and/or stored event data, whether or not the events are correlated in close temporal proximity, and whether the events and data come from one or several event and data sources. Various classification (explicitly and/or implicitly trained) schemes and/or systems (e.g., support vector machines, neural networks, expert systems, Bayesian belief networks, fuzzy logic, data fusion engines . . . ) can be employed in connection with performing automatic and/or inferred action in connection with the claimed subject matter.

A classifier can be a function that maps an input attribute vector, $x=(x1, x2, x3, x4, xn)$, to a confidence that the input belongs to a class, that is, $f(x)=confidence(class)$. Such classification can employ a probabilistic and/or statistical-based analysis (e.g., factoring into the analysis utilities and costs) to prognose or infer an action that a user desires to be automatically performed. A support vector machine (SVM) is an example of a classifier that can be employed. The SVM operates by finding a hyper-surface in the space of possible inputs, where the hyper-surface attempts to split the triggering criteria from the non-triggering events. Intuitively, this makes the classification correct for testing data that is near, but not identical to training data. Other directed and undirected model classification approaches include, e.g., naïve Bayes, Bayesian networks, decision trees, neural networks, fuzzy logic models, and probabilistic classification models providing different patterns of independence can be employed. Classification as used herein also is inclusive of statistical regression that is utilized to develop models of priority.

In addition, intelligence component 602 (or in some cases rendering component 114, possibly with the assistance of intelligence component 602) can intelligently determine or infer a chart type or aspects associated with visualization descriptor 218 based upon features included in underlying data such as values, headers, classifications and so forth of data included in data source 206. As one example, if the underlying data includes or relates to time-based formatting, then this format information can be utilized to infer that a time axis can be appropriate for at least one chart in visual representation 116. As another example, if a percent sign is used in a column header or it can be inferred that data is intended to represent a portion of the whole, then chart type can be weighted toward a suitable type such as a pie chart. If data is inferred to be monetary or binary or trinary, then red-green-neutral (or similar) colors can be selected for the visualization. Likewise, if data is inferred to be of a continuous nature, then RGB pixel features can be effectively utilized. Of course numerous other examples exist, however, it should be appreciated that such inference can be employed to provide chart type suggestions, for example to rendering component 114 or to designer component 302.

Figure 7:
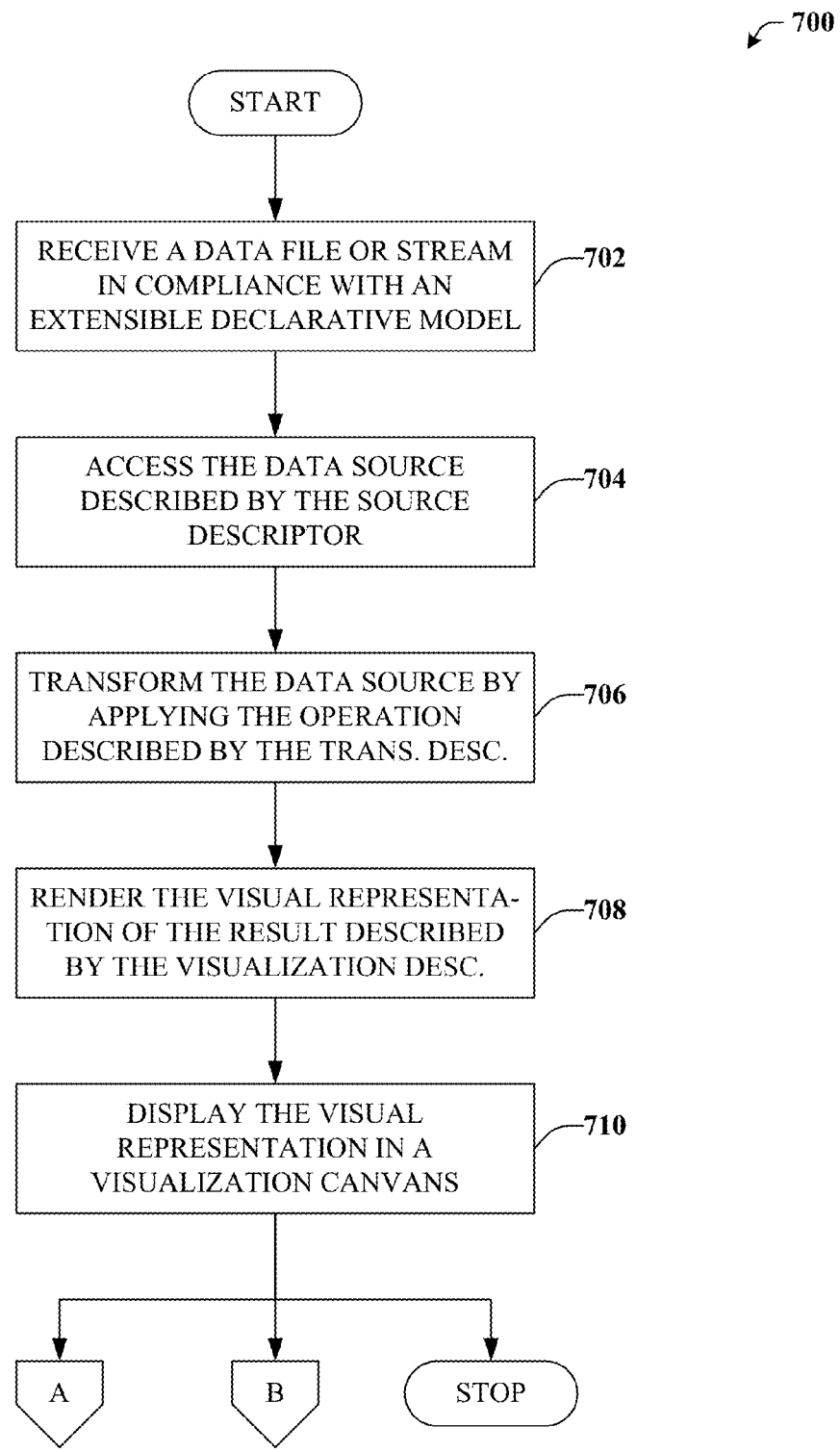
FIG. 7 depicts an exemplary flow chart of procedures that define a method for facilitating rich customization of visualizations based upon a declarative model.
Figure 8:
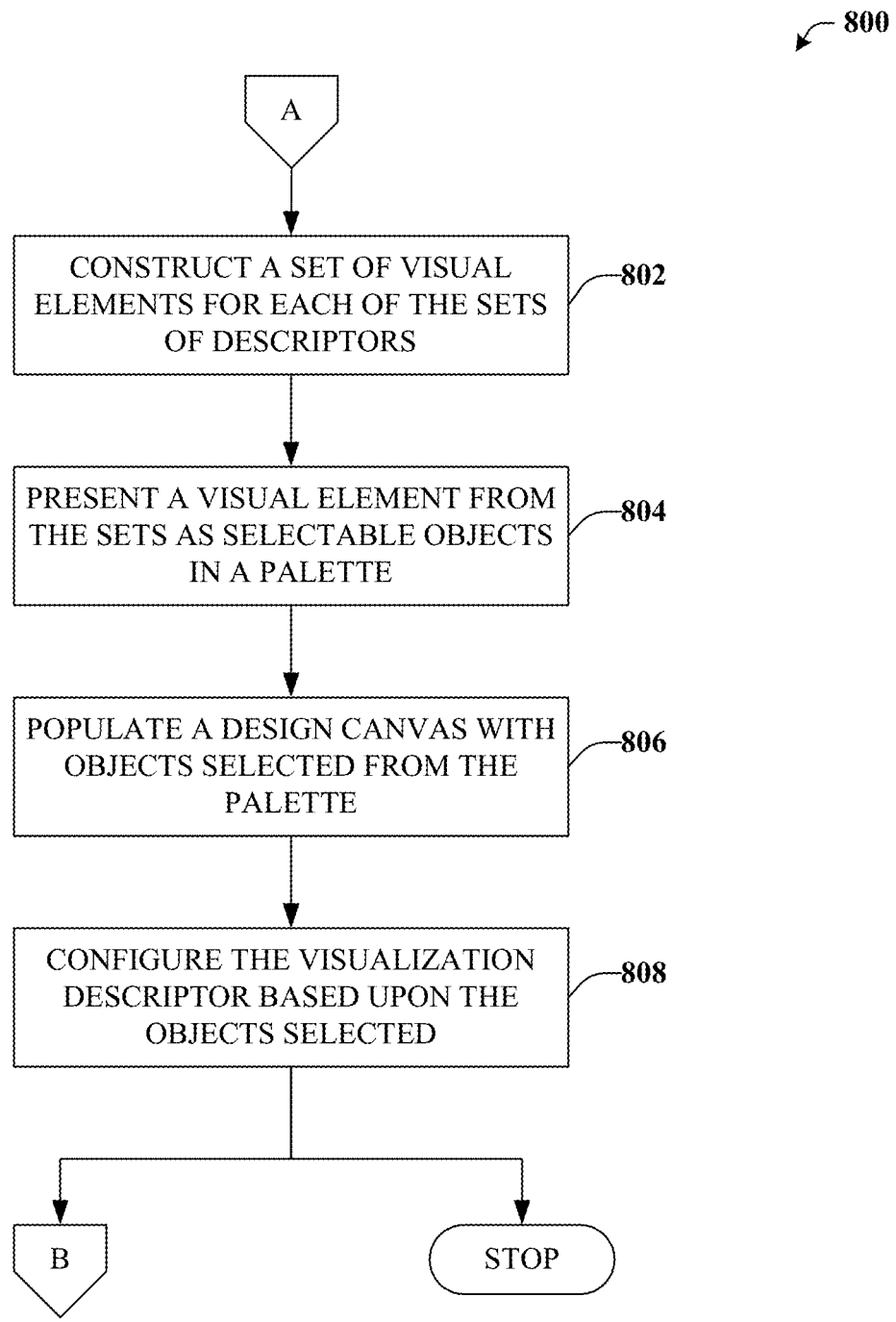
FIG. 8 illustrates an exemplary flow chart of procedures that define a method for providing a rich set of design features in connection with a declarative model.
Figure 9:
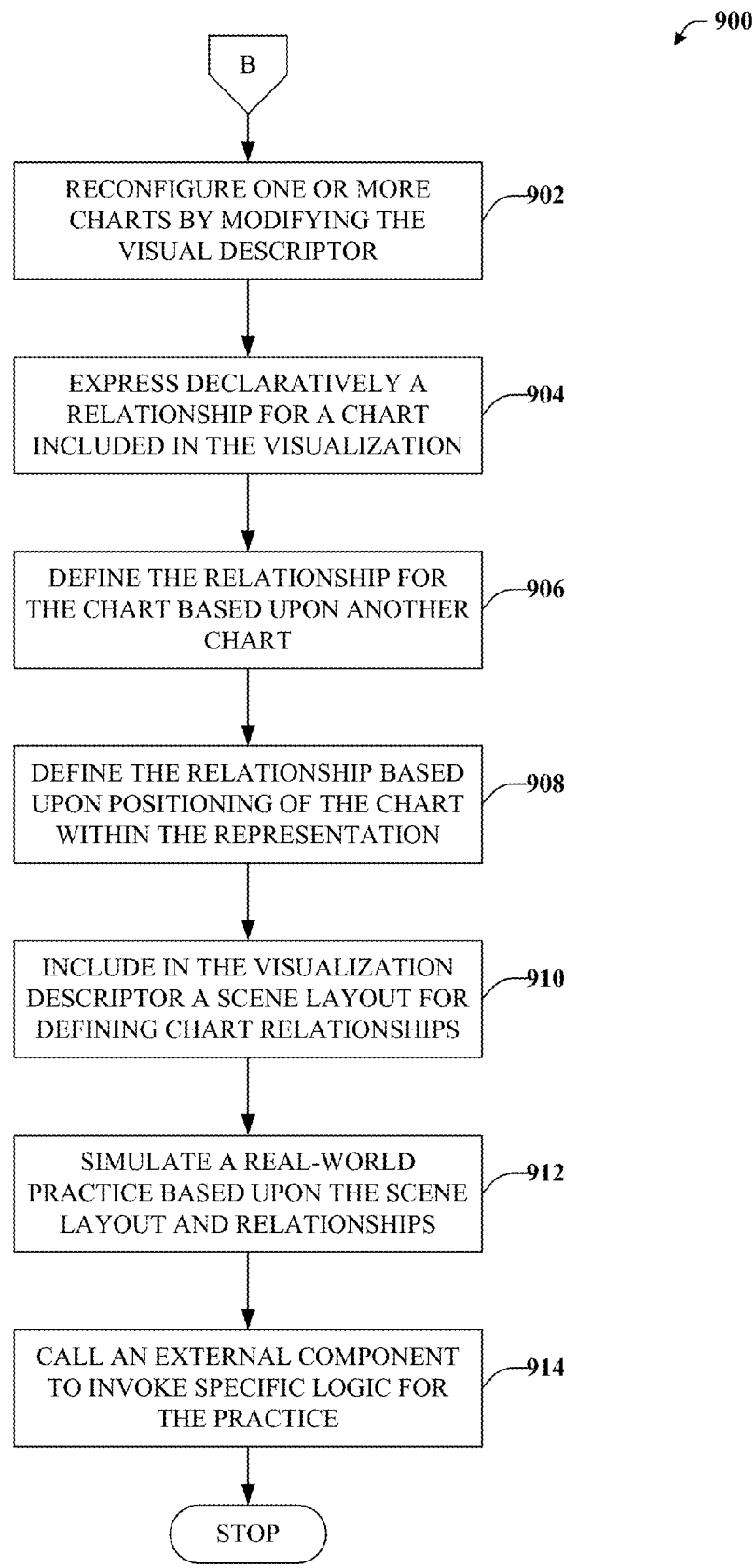
FIG. 9 depicts an exemplary flow chart of procedures defining a method for providing additional features with respect to the declarative model or language.

FIGS. 7, 8, and 9 illustrate various methodologies in accordance with the claimed subject matter. While, for purposes of simplicity of explanation, the methodologies are shown and described as a series of acts, it is to be understood and appreciated that the claimed subject matter is not limited by the order of acts, as some acts may occur in different orders and/or concurrently with other acts from that shown and described herein. For example, those skilled in the art will understand and appreciate that a methodology could alternatively be represented as a series of interrelated states or events, such as in a state diagram. Moreover, not all illustrated acts may be required to implement a methodology in accordance with the claimed subject matter. Additionally, it should be further appreciated that the methodologies disclosed hereinafter and throughout this specification are capable of being stored on an article of manufacture to facilitate transporting and transferring such methodologies to computers. The term article of manufacture, as used herein, is intended to encompass a computer program accessible from any computer-readable device, carrier, or media.

With reference now to FIG. 7, exemplary computer implemented method 700 for facilitating rich customization of visualizations based upon a declarative model is illustrated. Generally, at reference numeral 702, a data file or stream can be received, wherein the file or stream is in compliance with an extensible declarative model defining a set of source descriptors, a set of transform descriptors, and a set of visualization descriptors. Typically, a source descriptor declaratively describes a data source such e.g., substantially any database or spreadsheet; an entity (e.g., a set of related records) or a data set included in the database (or spreadsheet); a collection of entities or data sets included in the database, or a collection of databases.

Similarly, a transform descriptor can declaratively describe an operation that acts on the data source for providing a result. Typically, the operation will be a slice operation, an aggregation operation, a sort operation, or a join operation, and so forth that acts on data source in a suitable manner. As another example, the operation can be a purely visual transformation such as, e.g., switching between a bar chart and a pie chart, wherein the representative data is not necessarily altered. Furthermore, the operation can also be an arithmetic operation or transformation as well. Additionally, a visualization descriptor can declaratively describe a visual representation of the result, such as a chart or another visual representation of the underlying data arrived at in the result by applying the operation upon the data source.

At reference numeral 704, the data source described by the source descriptor can be accessed, for example, to obtain or copy source data. Once obtained, at reference numeral 706, all or portions of data included in the data source can be transformed by applying the operation described by the transform descriptor. Next, at reference numeral 708, the visual representation of the result described by the transform descriptor can be rendered, and at reference numeral 710, the visual representation can be displayed in a visualization canvas.

Referring to FIG. 8, exemplary computer implemented method 800 for providing a rich set of design features in connection with a declarative model is depicted. Initially, at reference numeral 802, a set of visual elements can be constructed for each of the sets of source descriptors, transform descriptors, and visualization descriptors included in the data file or stream received at act 702. Appreciably, the visual elements can be ad hoc representations based upon visually distinct shapes, sizes, or features; or be categorized based upon type (e.g., type of descriptor); or in some cases be intuitively representative of behavior or features of the underlying descriptor or type of descriptor.

At reference numeral 804 a visual element from the set of visual elements can be presented as a selectable object in a palette. Understandably, the palette can include virtually any number of visual elements and can be ordered or classified by element type, which can in turn be defined that the underlying descriptor type (e.g., source, transform, visualization . . . ). At reference numeral 806, a design canvas can be populated with objects selected from the palette. For example, objects can be dragged from the palette to the design canvas by manipulating I/O features associated with an operating environment, such as a mouse or touch display. Next, at reference numeral 808, the visualization descriptor can be configured based upon the objects selected from the palette and/or based upon the composition and relationships of such objects extant in the design canvas. For example, suitable information can be appended to relevant portions of the data file or stream or otherwise modified based upon visual elements constructed in design canvas.

With reference now to FIG. 9, method 900 for providing additional features with respect to the declarative model is illustrated. Generally, at reference numeral 902, an appearance, behavior, or feature of one or more charts included in the visual representation rendered at act 708 can be reconfigured by, e.g., modifying the visual descriptor portion or portions included in the data file or stream. For example, a visualization component can be readily modified by turning on or off various features, plugging in or unplugging particular features and so on.

At reference numeral 904, a relationship for a chart included in the visual representation can be declaratively expressed. At reference numeral 906, the relationship for a chart expressed at act 904 can be defined based upon another chart, while at reference numeral 908, the relationship for the chart can be defined based upon positioning of the chart within the visualization canvas or visual representation. For example, the relationship can be with other charts, visualizations, or objects included in the visual representation, or the relationship can be based upon a spatial or geographic position within the visual representation.

Then, at reference numeral 910, a declarative description of a scene layout can be included in the visualization descriptor. The scene layout can apply specifically to the visualization canvas (and/or visual representation) and can be particularly suited for defining chart relationships within the provided scene layout. Hence, source data, transformation operations, visualizations, associations with other visualizations and so forth can vary based upon the layout in addition to the other aspects described herein.

At reference numeral 912 a real-world practice can be simulated based upon the scene layout as well as based upon relationships included in the visualization descriptor of the data stream or file. For example, the real-world practice can relate to common business applications such as commercial activities, manufacturing, logistics, etc., with real-world facilities or machinery described by a virtual counterpart included in the scene layout. At reference numeral 914, an external component can be called to invoke specific logic for the real-world practice, typically for complex or personalized practices.

Figure 10:
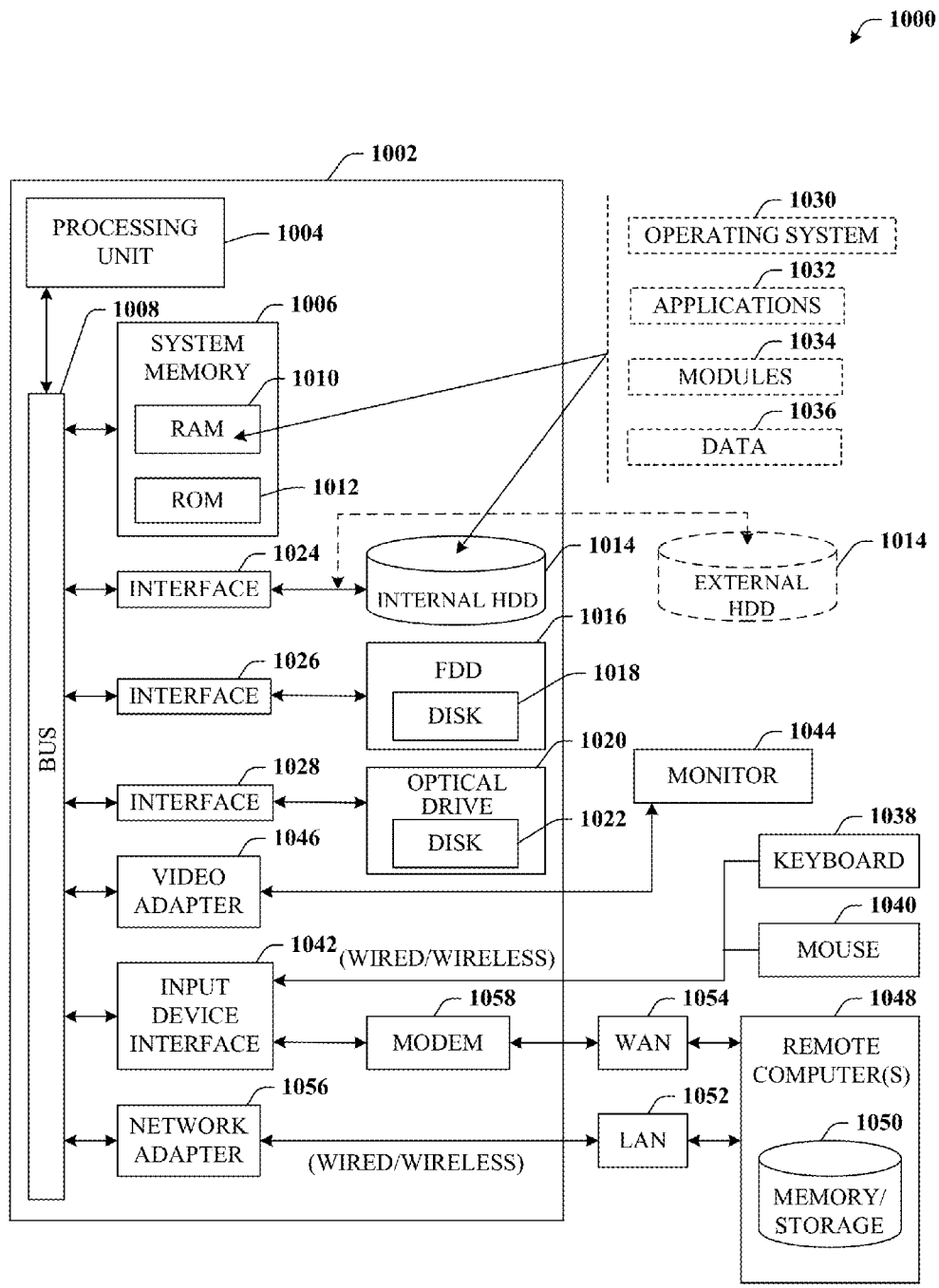
FIG. 10 illustrates a block diagram of a computer operable to execute the disclosed architecture.

Referring now to FIG. 10, there is illustrated a block diagram of an exemplary computer system operable to execute the disclosed architecture. In order to provide additional context for various aspects of the claimed subject matter, FIG. 10 and the following discussion are intended to provide a brief, general description of a suitable computing environment 1000 in which the various aspects of the claimed subject matter can be implemented. Additionally, while the claimed subject matter described above may be suitable for application in the general context of computer-executable instructions that may run on one or more computers, those skilled in the art will recognize that the claimed subject matter also can be implemented in combination with other program modules and/or as a combination of hardware and software.

Generally, program modules include routines, programs, components, data structures, etc., that perform particular tasks or implement particular abstract data types. Moreover, those skilled in the art will appreciate that the inventive methods can be practiced with other computer system configurations, including single-processor or multiprocessor computer systems, minicomputers, mainframe computers, as well as personal computers, hand-held computing devices, microprocessor-based or programmable consumer electronics, and the like, each of which can be operatively coupled to one or more associated devices.

The illustrated aspects of the claimed subject matter may also be practiced in distributed computing environments where certain tasks are performed by remote processing devices that are linked through a communications network. In a distributed computing environment, program modules can be located in both local and remote memory storage devices.

A computer typically includes a variety of computer-readable media. Computer-readable media can be any available media that can be accessed by the computer and includes both volatile and nonvolatile media, removable and non-removable media. By way of example, and not limitation, computer-readable media can comprise computer storage media and communication media. Computer storage media can include both volatile and nonvolatile, removable and non-removable media implemented in any method or technology for storage of information such as computer-readable instructions, data structures, program modules or other data. Computer storage media includes, but is not limited to, RAM, ROM, EEPROM, flash memory or other memory technology, CD-ROM, digital versatile disk (DVD) or other optical disk storage, magnetic cassettes, magnetic tape, magnetic disk storage or other magnetic storage devices, or any other medium which can be used to store the desired information and which can be accessed by the computer.

Communication media typically embodies computer-readable instructions, data structures, program modules or other data in a modulated data signal such as a carrier wave or other transport mechanism, and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. Combinations of the any of the above should also be included within the scope of computer-readable media.

With reference again to FIG. 10, the exemplary environment 1000 for implementing various aspects of the claimed subject matter includes a computer 1002, the computer 1002 including a processing unit 1004, a system memory 1006 and a system bus 1008. The system bus 1008 couples to system components including, but not limited to, the system memory 1006 to the processing unit 1004. The processing unit 1004 can be any of various commercially available processors. Dual microprocessors and other multi-processor architectures may also be employed as the processing unit 1004.

The system bus 1008 can be any of several types of bus structure that may further interconnect to a memory bus (with or without a memory controller), a peripheral bus, and a local bus using any of a variety of commercially available bus architectures. The system memory 1006 includes read-only memory (ROM) 1010 and random access memory (RAM) 1012. A basic input/output system (BIOS) is stored in a nonvolatile memory 1010 such as ROM, EPROM, EEPROM, which BIOS contains the basic routines that help to transfer information between elements within the computer 1002, such as during start-up. The RAM 1012 can also include a high-speed RAM such as static RAM for caching data.

The computer 1002 further includes an internal hard disk drive (HDD) 1014 (e.g., EIDE, SATA), which internal hard disk drive 1014 may also be configured for external use in a suitable chassis (not shown), a magnetic floppy disk drive (FDD) 1016, (e.g., to read from or write to a removable diskette 1018) and an optical disk drive 1020, (e.g., reading a CD-ROM disk 1022 or, to read from or write to other high capacity optical media such as the DVD). The hard disk drive 1014, magnetic disk drive 1016 and optical disk drive 1020 can be connected to the system bus 1008 by a hard disk drive interface 1024, a magnetic disk drive interface 1026 and an optical drive interface 1028, respectively. The interface 1024 for external drive implementations includes at least one or both of Universal Serial Bus (USB) and IEEE1394 interface technologies. Other external drive connection technologies are within contemplation of the subject matter claimed herein.

The drives and their associated computer-readable media provide nonvolatile storage of data, data structures, computer-executable instructions, and so forth. For the computer 1002, the drives and media accommodate the storage of any data in a suitable digital format. Although the description of computer-readable media above refers to a HDD, a removable magnetic diskette, and a removable optical media such as a CD or DVD, it should be appreciated by those skilled in the art that other types of media which are readable by a computer, such as zip drives, magnetic cassettes, flash memory cards, cartridges, and the like, may also be used in the exemplary operating environment, and further, that any such media may contain computer-executable instructions for performing the methods of the claimed subject matter.

A number of program modules can be stored in the drives and RAM 1012, including an operating system 1030, one or more application programs 1032, other program modules 1034 and program data 1036. All or portions of the operating system, applications, modules, and/or data can also be cached in the RAM 1012. It is appreciated that the claimed subject matter can be implemented with various commercially available operating systems or combinations of operating systems.

A user can enter commands and information into the computer 1002 through one or more wired/wireless input devices, e.g., a keyboard 1038 and a pointing device, such as a mouse 1040. Other input devices (not shown) may include a microphone, an IR remote control, a joystick, a game pad, a stylus pen, touch screen, or the like. These and other input devices are often connected to the processing unit 1004 through an input device interface 1042 that is coupled to the system bus 1008, but can be connected by other interfaces, such as a parallel port, an IEEE1394 serial port, a game port, a USB port, an IR interface, etc.

A monitor 1044 or other type of display device is also connected to the system bus 1008 via an interface, such as a video adapter 1046. In addition to the monitor 1044, a computer typically includes other peripheral output devices (not shown), such as speakers, printers, etc.

The computer 1002 may operate in a networked environment using logical connections via wired and/or wireless communications to one or more remote computers, such as a remote computer(s) 1048. The remote computer(s) 1048 can be a workstation, a server computer, a router, a personal computer, portable computer, microprocessor-based entertainment appliance, a peer device or other common network node, and typically includes many or all of the elements described relative to the computer 1002, although, for purposes of brevity, only a memory/storage device 1050 is illustrated. The logical connections depicted include wired/wireless connectivity to a local area network (LAN) 1052 and/or larger networks, e.g., a wide area network (WAN) 1054. Such LAN and WAN networking environments are commonplace in offices and companies, and facilitate enterprise-wide computer networks, such as intranets, all of which may connect to a global communications network, e.g., the Internet.

When used in a LAN networking environment, the computer 1002 is connected to the local network 1052 through a wired and/or wireless communication network interface or adapter 1056. The adapter 1056 may facilitate wired or wireless communication to the LAN 1052, which may also include a wireless access point disposed thereon for communicating with the wireless adapter 1056.

When used in a WAN networking environment, the computer 1002 can include a modem 1058, or is connected to a communications server on the WAN 1054, or has other means for establishing communications over the WAN 1054, such as by way of the Internet. The modem 1058, which can be internal or external and a wired or wireless device, is connected to the system bus 1008 via the serial port interface 1042. In a networked environment, program modules depicted relative to the computer 1002, or portions thereof, can be stored in the remote memory/storage device 1050. It will be appreciated that the network connections shown are exemplary and other means of establishing a communications link between the computers can be used.

The computer 1002 is operable to communicate with any wireless devices or entities operatively disposed in wireless communication, e.g., a printer, scanner, desktop and/or portable computer, portable data assistant, communications satellite, any piece of equipment or location associated with a wirelessly detectable tag (e.g., a kiosk, news stand, restroom), and telephone. This includes at least Wi-Fi and Bluetooth™ wireless technologies. Thus, the communication can be a predefined structure as with a conventional network or simply an ad hoc communication between at least two devices.

Wi-Fi, or Wireless Fidelity, allows connection to the Internet from a couch at home, a bed in a hotel room, or a conference room at work, without wires. Wi-Fi is a wireless technology similar to that used in a cell phone that enables such devices, e.g., computers, to send and receive data indoors and out; anywhere within the range of a base station. Wi-Fi networks use radio technologies called IEEE802.11 (a, b, g, etc.) to provide secure, reliable, fast wireless connectivity. A Wi-Fi network can be used to connect computers to each other, to the Internet, and to wired networks (which use IEEE802.3 or Ethernet). Wi-Fi networks operate in the unlicensed 2.4 and 5 GHz radio bands, at an 10 Mbps (802.11b) or 54 Mbps (802.11a) data rate, for example, or with products that contain both bands (dual band), so the networks can provide real-world performance similar to the basic "10 BaseT" wired Ethernet networks used in many offices.

Figure 11:
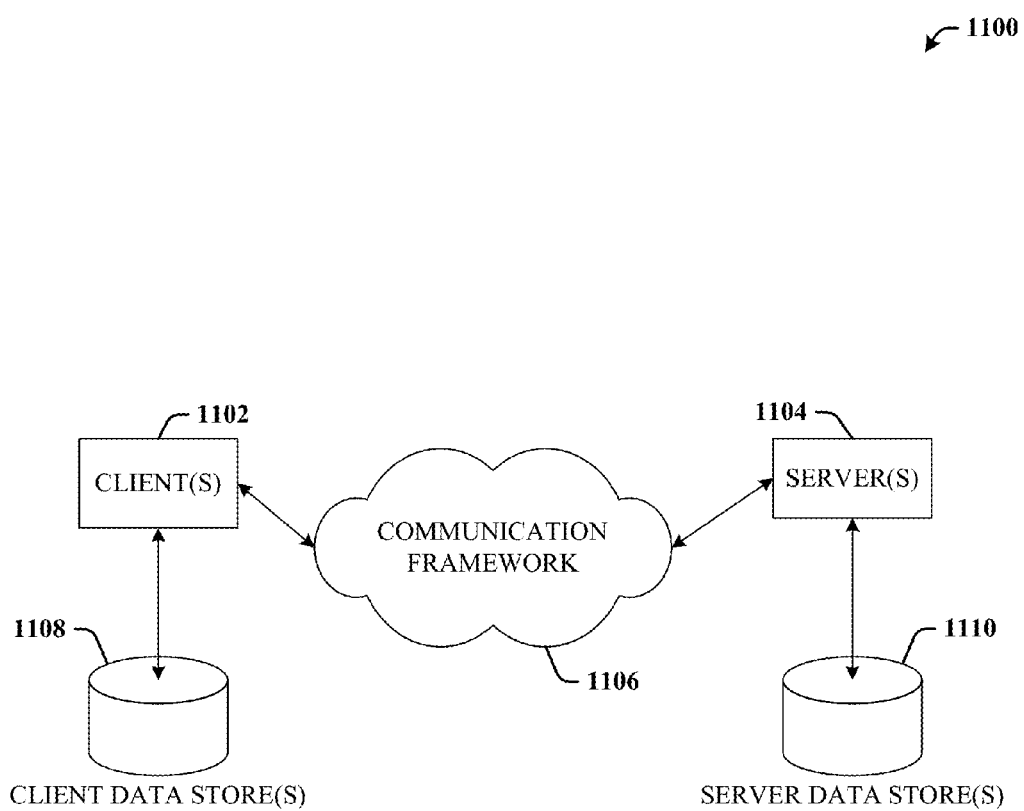
FIG. 11 illustrates a schematic block diagram of an exemplary computing environment.

Referring now to FIG. 11, there is illustrated a schematic block diagram of an exemplary computer compilation system operable to execute the disclosed architecture. The system 1100 includes one or more client(s) 1102. The client(s) 1102 can be hardware and/or software (e.g., threads, processes, computing devices). The client(s) 1102 can house cookie(s) and/or associated contextual information by employing the claimed subject matter, for example.

The system 1100 also includes one or more server(s) 1104. The server(s) 1104 can also be hardware and/or software (e.g., threads, processes, computing devices). The servers 1104 can house threads to perform transformations by employing the claimed subject matter, for example. One possible communication between a client 1102 and a server 1104 can be in the form of a data packet adapted to be transmitted between two or more computer processes. The data packet may include a cookie and/or associated contextual information, for example. The system 1100 includes a communication framework 1106 (e.g., a global communication network such as the Internet) that can be employed to facilitate communications between the client(s) 1102 and the server(s) 1104.

Communications can be facilitated via a wired (including optical fiber) and/or wireless technology. The client(s) 1102 are operatively connected to one or more client data store(s) 1108 that can be employed to store information local to the client(s) 1102 (e.g., cookie(s) and/or associated contextual information). Similarly, the server(s) 1104 are operatively connected to one or more server data store(s) 1110 that can be employed to store information local to the servers 1104.

What has been described above includes examples of the various embodiments. It is, of course, not possible to describe every conceivable combination of components or methodologies for purposes of describing the embodiments, but one of ordinary skill in the art may recognize that many further combinations and permutations are possible. Accordingly, the detailed description is intended to embrace all such alterations, modifications, and variations that fall within the spirit and scope of the appended claims.

In particular and in regard to the various functions performed by the above described components, devices, circuits, systems and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments. In this regard, it will also be recognized that the embodiments includes a system as well as a computer-readable medium having computer-executable instructions for performing the acts and/or events of the various methods.

In addition, while a particular feature may have been disclosed with respect to only one of several implementations, such feature may be combined with one or more other features of the other implementations as may be desired and advantageous for any given or particular application. Furthermore, to the extent that the terms "includes," and "including" and variants thereof are used in either the detailed description or the claims, these terms are intended to be inclusive in a manner similar to the term "comprising."

What is claimed is:

1. A computer implemented system that facilitates a declarative approach to constructing richly customizable and interactive data visualizations, comprising:

at least one processor and at least one memory, the at least one memory storing one or more components executable by the one or more processors, the one or more components including:

a receiving component that receives data that conforms to an extensible declarative language, the language includes at least: a set of source descriptors each of which declaratively describes a respective data source, a set of transform descriptors each of which declaratively describes a respective operation applied to the respective data source to yield a transformed result, and a set of visualization descriptors each of which declaratively describes a respective visual representation of the transformed result, each visualization descriptor from the data declaratively describing an appearance, a behavior, or one or more features of the respective visual representation; and a rendering component that reads a visualization descriptor from the data and that composes an associated visual representation of the transformed result in a visualization canvas.

2. The system of claim 1, further comprising an access component that reads a source descriptor from the data and that accesses an associated data source; the data source is at least one of a database, an entity or data set included in the database, a collection of entities or data sets included in the database, or a collection of databases.

3. The system of claim 1, further comprising a transformation component that reads a transform descriptor from the data and that applies an associated operation in order to generate the transformed result.

4. The system of claim 3, the operation is at least one of a filter, a slice, an aggregation, a sort, or a join that acts on at least a portion of a data source.

5. The system of claim 1, further comprising a designer component that receives the data and that generates a set of visual elements each of which corresponds to a source descriptor, a transform descriptor, or a visualization descriptor.

6. The system of claim 5, further comprising a palette and a design canvas, the designer component displays the set of visual elements to the palette and displays a visual element selected from the palette to the design canvas.

7. The system of claim 6, the designer component adapts the visualization descriptor from the data based upon a composition displayed in the design canvas.

8. The system of claim 1, the visual representation is a chart and each visualization descriptor from the data declaratively describes the appearance, the behavior, or the one or more features of the visual representation in an extensible manner; wherein the appearance, the behavior, or the one or more features of the visual representation are selectively reconfigured by modification of the visualization descriptor portion of the data.

9. The system of claim 1, the visual representation includes a set of charts and the visualization descriptor portion of the data declaratively expresses a relationship for each chart in the set of charts.

10. The system of claim 9, the relationship for a first chart is associated with a second chart, or the relationship for a chart is based upon a position of the chart within the visualization canvas.

11. The system of claim 9, the visualization descriptor portion of the data declaratively describes a layout of the visualization canvas that defines the relationship.

12. The system of claim 11, further comprising a simulation component that provides a simulation of the layout and relationships included in the visualization descriptor.

13. The system of claim 12, the simulation component calls an external component to invoke specific logic for the simulation.

14. The system of claim 12, further comprising an intelligence component that infers a chart type or aspects associated with the visualization descriptor based upon features included in underlying data.

15. The system of claim 1, wherein the visualization descriptor from the data declaratively describes the appearance, the behavior, or the one or more features of the respective visual representation that is to be rendered without describing how at least part of the respective visual representation is to be rendered.

16. The system of claim 1, wherein one of:
at least one of the set of transform descriptors of the extensible declarative language includes a text or a code portion that declaratively describes at least part of the respective operation in a non-procedural and non-imperative manner; and at least one of the set of visualization descriptors of the extensible declarative language includes a text or a code portion that declaratively describes at least part of a respective visual representation to be rendered in a non-procedural and non-imperative manner.

17. A computer implemented method for facilitating rich customization of visualizations based upon a declarative model, comprising:
receiving a data file or stream in compliance with an extensible declarative model defining a set of source descriptors, a set of transform descriptors, and a set of visualization descriptors, a source descriptor declaratively describes a data source, a transform descriptor declaratively describes an operation that acts on the data source for providing a result, and a visualization descriptor declaratively describes at least one of an appearance, a behavior, or one or more features of a visual representation of the result;
accessing the data source described by the source descriptor;
transforming the data source by applying the operation described by the transform descriptor;
rendering the visual representation of the result described by the visualization descriptor; and
displaying the visual representation in a visualization canvas.

18. The method of claim 17, further comprising at least one of the following acts:
constructing a set of visual elements for each of the set of source descriptors, the set of transform descriptors and the set of visualization descriptors;
presenting a visual element from the set of visual elements as a selectable object in a palette;
populating a design canvas with objects selected from the palette; or
configuring the visualization descriptor based upon the objects selected from the palette.

19. The method of claim 17, further comprising at least one of the following acts:
reconfiguring an appearance, behavior, or feature of one or more charts included in the visual representation by modifying the visualization descriptor;
expressing declaratively a relationship for a chart included in the visual representation;
defining the relationship for the chart based upon another chart;
defining the relationship for the chart based upon positioning of the chart within the visualization canvas;
including in the visualization descriptor a declarative description of a scene layout of the visualization canvas for defining chart relationships;
simulating a real-world practice based upon the scene layout and relationships included in the visualization descriptor; or
calling an external component to invoke specific logic for the practice.

20. A computer implemented system that facilitates a declarative approach to constructing richly customizable and interactive data visualizations, comprising:
at least one processor and at least one memory, the at least one memory storing one or more components executable by the one or more processors, the one or more components including:
an extensible model or language that declaratively describes a source descriptor, a transform descriptor, and a visualization descriptor;

a designer component that presents in an interactive palette visual elements associated with each descriptor included in the model or language and that populates a design canvas with visual elements selected from the palette, the designer component further appends information to the visualization descriptor based upon activity conducted in the design canvas;

an access component accesses a data source declaratively described by the source descriptor;

a transformation component that transforms a portion of the data source into a result based upon an operation declaratively described by the transform descriptor; and a rendering component that displays in a visualization canvas a visual representation of one or more charts declaratively described by the visualization descriptor, the visualization descriptor declaratively describing at least one of an appearance, a behavior, or one or more features of the visual representation.

\* \* \* \* \*